(12) United States Patent
Wu et al.

(10) Patent No.: US 11,735,579 B2
(45) Date of Patent: Aug. 22, 2023

(54) ELECTROSTATIC DISCHARGE PREVENTION

(71) Applicant: Taiwan Semiconductor Manufacturing Company, Ltd., Hsinchu (TW)

(72) Inventors: Ting-Yun Wu, Taipei (TW); Yen-Sen Wang, Hsinchu (TW); Chung-Yi Lin, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 84 days.

(21) Appl. No.: 17/495,638

(22) Filed: Oct. 6, 2021

(65) Prior Publication Data
US 2022/0415878 A1 Dec. 29, 2022

Related U.S. Application Data

(60) Provisional application No. 63/214,398, filed on Jun. 24, 2021.

(51) Int. Cl.
*H01L 27/02* (2006.01)
*H01L 29/861* (2006.01)

(52) U.S. Cl.
CPC ...... *H01L 27/0255* (2013.01); *H01L 27/0296* (2013.01); *H01L 29/861* (2013.01)

(58) Field of Classification Search
CPC ............ H01L 27/0255; H01L 27/0296; H01L 27/0886; H01L 29/41791; H01L 29/785; H01L 29/861
See application file for complete search history.

(56) References Cited

U.S. PATENT DOCUMENTS

2020/0403007 A1* 12/2020 Thomson ............ H01L 29/8613

OTHER PUBLICATIONS

Huang, Yu-Xuan et al, "Backside PN Junction Diode", U.S. Appl. No. 16/901,816, filed Jun. 15, 2020, Assignee: Taiwan Semiconductor Manufacturing Co., Ltd., 26 pages specification, 17 pages drawings.

* cited by examiner

*Primary Examiner* — Matthew C Landau
*Assistant Examiner* — Mark Hatzilambrou
(74) *Attorney, Agent, or Firm* — Haynes and Boone, LLP

(57) ABSTRACT

The present disclosure provides embodiments of semiconductor structures. A semiconductor structure according to the present disclosure includes a substrate, a fin-shaped structure disposed over the substrate, the fin-shaped structure including a plurality of first semiconductor layers interleaved by a plurality of second semiconductor layers, a gate structure disposed over a channel region of the fin-shaped structure, a first source/drain feature extending through at least a first portion the fin-shaped structure, a second source/drain feature extending through at least a second portion of the fin-shaped structure, and a backside metal line disposed below the substrate and spaced apart from the first source/drain feature and the second source/drain feature.

20 Claims, 11 Drawing Sheets

ELECTROSTATIC DISCHARGE PREVENTION

PRIORITY DATA

This application claims priority to U.S. Provisional Patent Application Ser. No. 63/214,398, filed Jun. 24, 2021, the entire disclosure of which is incorporated herein by reference.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

As integrated circuit devices are scaling down, so are the electrostatic discharge (ESD) prevention devices. ESD prevention devices that are designed and fabricated based on existing rule constraints may not function properly in a different technology generation. Therefore, while existing ESD prevent devices are generally adequate for their intended purposes, they are not satisfactory in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
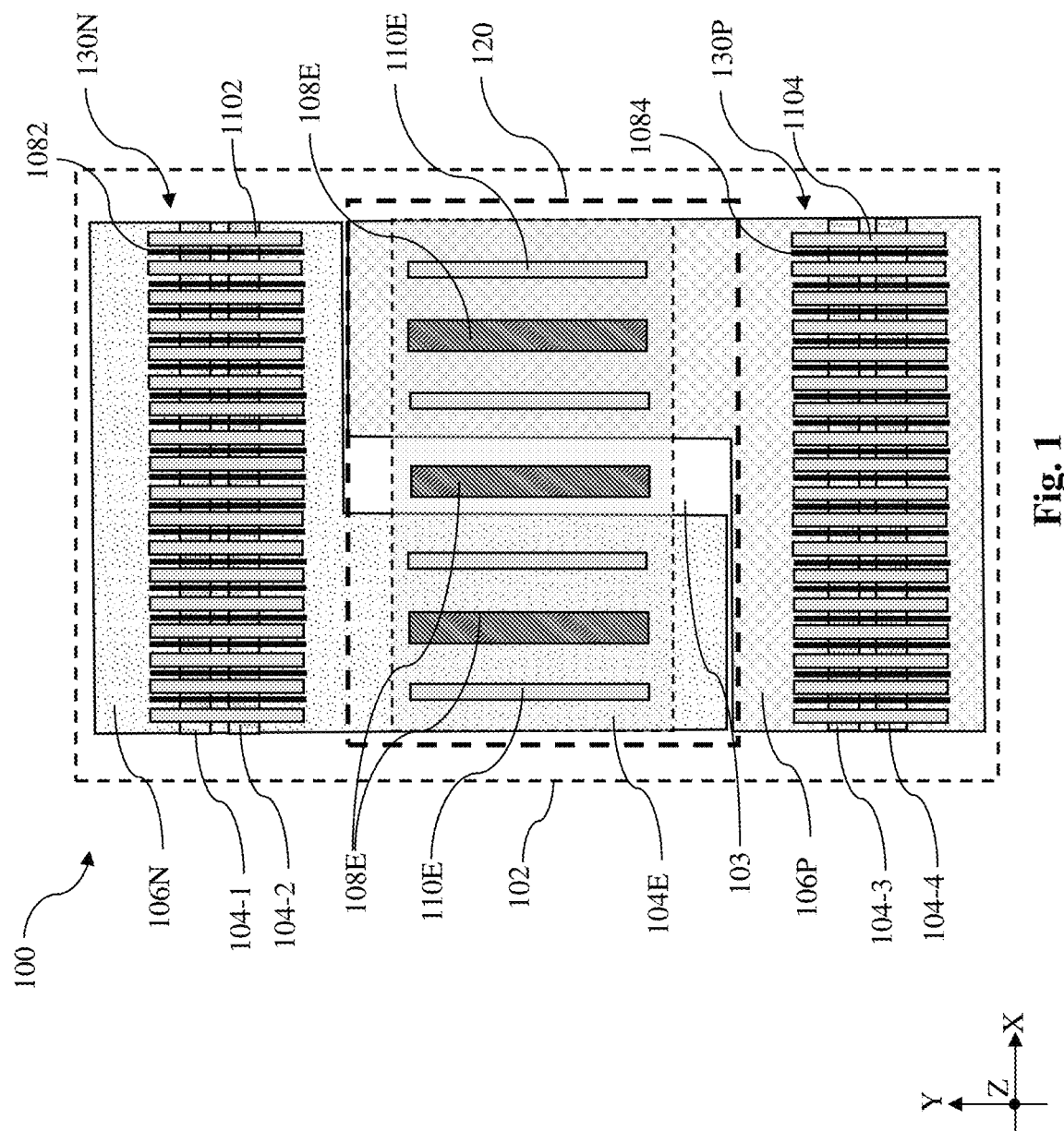
FIG. 1 is a top view of a semiconductor structure according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure generally relates to ESD prevention devices. Particularly, the present disclosure relates to ESD prevention devices that includes a backside interconnect structure.

Electrostatic discharge (ESD) is a sudden flow of electricity between two charged objects caused by a physical contact, an electrical short, or a dielectric breakdown. ESD protection devices are implemented to protect ICs from damages caused by ESD. Example ESD protection devices include ESD diodes, ESD varactor diodes, ESD bipolar junction transistors (BJTs). As scaled down ICs only get more sensitive to ESD, ESD protection circuits or devices and their integration with ICs of different generation become an area of focus. Super power rails (SPRs) or backside power rails have been introduced to ease the routing pressure from the frontside interconnect structure. In some existing techniques, formation of the SPRs may accompany replacement of the semiconductor substrate with a backside dielectric layer. However, when the semiconductor substrate in the ESD device area is also replaced with the backside dielectric layer, the backside dielectric layer may break down and cause ESD device failure. To accommodate both ESD devices and SPRs, the semiconductor substrate may not be removed in the ESD device region. In the meantime, in order to prevent density loading effect during a chemical mechanical polishing (CMP) process, at least some backside power rails or backside metal lines are disposed directly below the ESD protection device. While these backside metal lines in the ESD area are dummy lines and are not intentionally coupled to the ESD devices in the ESD area, when not properly placed, they may become failure points or create risks of failures of the ESD devices.

The present disclosure provides embodiments of semiconductor structures that include ESD protection devices (e.g., ESD diode) and backside metal lines. In some embodiments, the ESD protection device may include an active region that is much wider than active regions in logic regions or pick-up regions. Although the active region may include a plurality of channel layers interleaved by a plurality of sacrificial layers, the plurality of sacrificial layers are not selectively removed to release the channel layers as channel members. As such, a gate structure is disposed over but not around the active region of the ESD protection device. The gate structure is electrically floating and does not play a role in the ESD protection functions. The semiconductor structure includes a first implantation region and a second implantation region. The first implantation region may be an n-type implantation region and the second implantation region may be a p-type implantation region. The present disclosure also includes rule constraints regarding the placement of the backside metal lines such that the ESD protection device may properly perform its functions.

The following description are provided in conjunction with the illustration in FIGS. 1-11. Throughout the disclosure, like reference numerals denote like features and may indicate similar compositions or formation processes unless otherwise described. For that reason, features with the same reference numerals may only be described once for simplicity. The X, Y, and Z directions are used consistent through on the figures and the Z direction may be referred to as the vertical direction.

Reference is first made to FIG. 1, which illustrates a top view of a semiconductor structure 100. In some embodiments represented in FIG. 1, the semiconductor structure 100 includes a substrate 102. The substrate 102 includes an n-type pick-up area 130N, an electrostatic discharge (ESD) area 120, and a p-type pick-up area 130P. The n-type pick-up area 130N includes a first active region 104-1 and a second active region 104-2. The ESD area 120 includes a wide active region 104E. The p-type pick-up area 130P includes a third active region 104-3 and a fourth active region 104-4. As shown in FIG. 1, the n-type pick-up area 130N includes a plurality of first gate structures 1082 that wrap around channel members in the first active region 104-1 and the second active region 104-2. The ESD area includes a plurality of floating gate structures 108E that are disposed on the wide active region 104E. The p-type pick-up area 130P includes a plurality of second gate structures 1084 that wrap around channel members in the third active region 104-3 and the fourth active region 104-4. The semiconductor structure 100 further includes a first implantation region 106N and a second implantation region 106P. The first implantation region 106N includes a first portion of the ESD area 120 and the entirety of the n-type pick-up area 130N. The second implantation region 106P includes a second portion of the ESD area 120 and the entirety of the p-type pick-up area 130P. The ESD area 120 also includes an intrinsic portion 103 that is disposed right between the first portion and the second portion. As shown in FIG. 1, a floating gate structure 108E is disposed in the first portion, another floating gate structure 108E is disposed in the intrinsic portion 103, and yet another floating gate structure 108E is disposed in the second portion. All the gate structures extend lengthwise along the Y direction.

Figure 4:
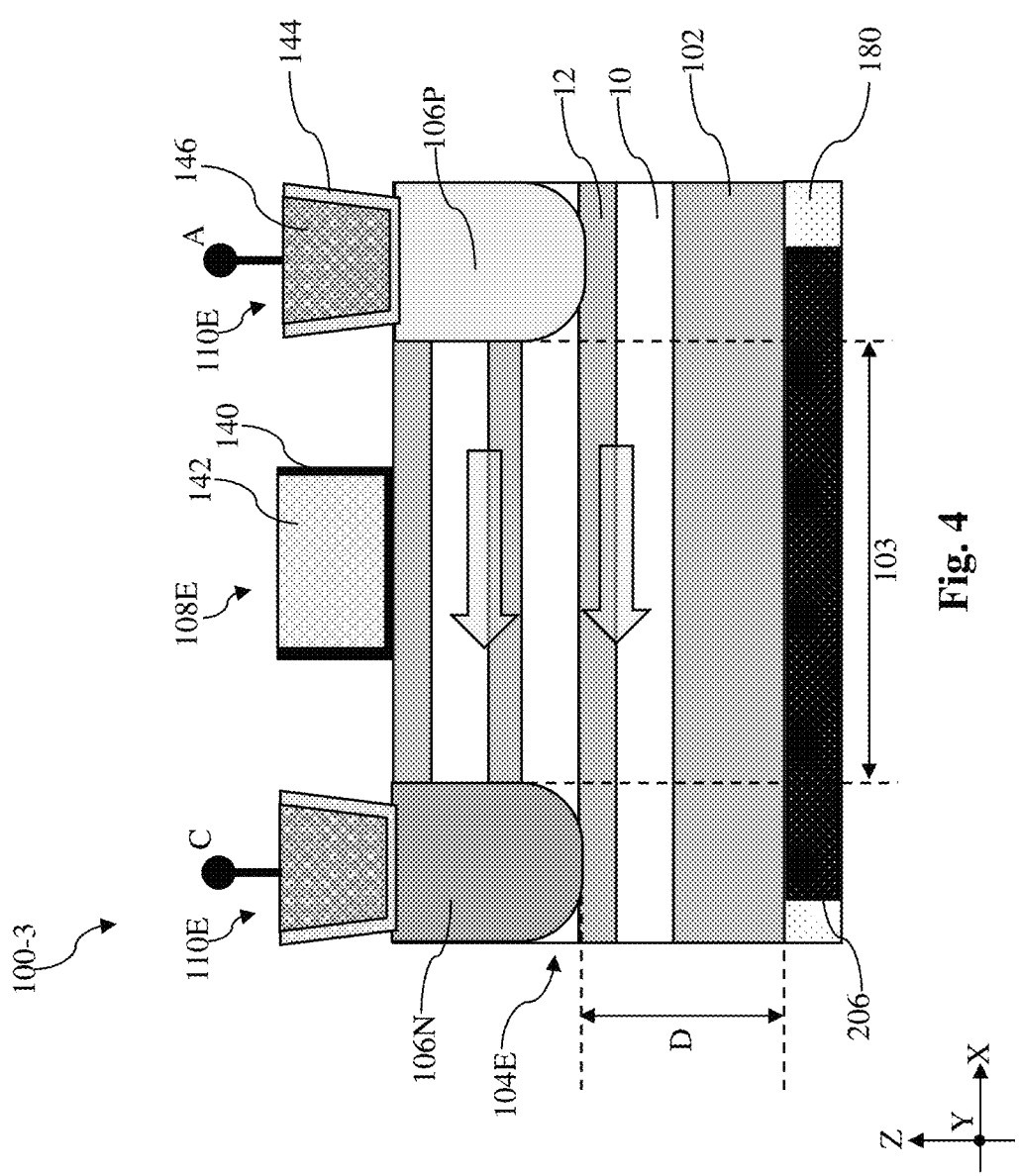
FIGS. 4-9 are fragmentary cross-sectional views of semiconductor device in an electrostatic discharge (ESD) area, according to various aspects of the present disclosure.

In some embodiments, the substrate 102 may be a semiconductor substrate such as a silicon (Si) substrate. Because the substrate 102 will be subject to ion implantations to form source/drain-like structures, the substrate 102 does not include any doping configurations or "wells" before the formation of the gate structures (i.e., 1082, 108E, 1084). The substrate 102 may also include other semiconductors such as germanium (Ge), silicon carbide (SiC), silicon germanium (SiGe), III-V semiconductors, or diamond. Further, the substrate 102 may optionally include one or more epitaxial layers. The first active region 104-1, the second active region 104-2, the third active region 104-3, the fourth active region 104-4, and the wide active region 104E are formed from a stack that includes alternating semiconductor layers. Referring briefly to FIG. 4, a cross-sectional view of the wide active region 104E shows that is in the stack of semiconductor layers. IN some embodiments, the stack may include a plurality of channel layers 12 and a plurality of sacrificial layers 10. The plurality of channel layers 12 are interleaved by the plurality of sacrificial layers 10. In other words, the channel layers 12 and the sacrificial layers 10 are stacked alternatingly one over another. A composition of the channel layers 12 and a composition of the sacrificial layers 10 are different. In one embodiment, the channel layers 12 are formed of silicon (Si) and the sacrificial layers 10 are formed silicon germanium (SiGe). Each of the first active region 104-1, the second active region 104-2, the third active region 104-3, and the fourth active region 104-4 has a first width along the Y direction. The wide active region 104E includes a second width along the Y direction. In some instances, the first width may be between about 10 nm and about 20 nm and the second width may be between about 50 nm and 200 nm. A ratio of the second width to the first width may be between about 5 and about 12. This ratio is not trivial. When the ratio is below 5, the wide active region 104E may not be wide enough to provide a low impedance path to divert the ESD current to the ground. When the ratio is greater than 12, the density loading effect will require the pick-up areas to be disposed further away, which may increase cell dimensions and may deteriorate the performance of the ESD protection device.

The plurality of first gate structures 1082, the floating gate structures 108E and the plurality of second gate structures 1084 may each include a gate dielectric layer and a gate electrode layer. In some embodiments, the gate dielectric layer may include an interfacial layer and a high-k dielectric layer. Here, high-k dielectric materials, as used and described herein, include dielectric materials having a high dielectric constant, for example, greater than that of thermal silicon oxide (~3.9). The interfacial layer may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The high-k dielectric layer may include hafnium oxide. Alternatively, the high-k dielectric layer may include other high-k dielectric materials, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), $Ba_7rO$, hafnium lanthanum oxide (HfLaO), lanthanum silicon oxide (LaSiO), aluminum silicon oxide (AlSiO), hafnium tantalum oxide (HMO), hafnium titanium oxide (HfTiO), $(Ba,Sr)TiO_3$ (BST), silicon nitride (SiN), silicon oxynitride (SiON), combinations thereof, or other suitable material. The high-K gate dielectric layer may be formed by ALD, physical vapor deposition (PVD), CVD, oxidation, and/or other suitable methods.

The gate electrode layer of the gate structures may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. In various embodiments, the gate electrode layer may be formed by ALD, PVD, CVD, e-beam evaporation, or other suitable process. In various embodiments, a CMP process may be performed to remove excessive metal, thereby providing a substantially planar top surface of the gate structures.

The floating gate structures 108E is different from the first gate structures 1082 and the second gate structures 1084. The sacrificial layers 10 in the first active region 104-1, the second active region 104-2, the third active region 104-3, and the fourth active region 104-4 are selectively removed to release the channel layers 12 as channel members. As such, the first gate structures 1082 wraps around each of the channel members in the n-type pick-up area 130N. The second gate structures 1084 wraps around each of the channel members in the p-type pick-up area 130P. That is, a portion of the first gate structures 1082 extend between vertically adjacent channel members and a portion of the second gate structures 1084 extend between vertically adjacent channel members. Because the channel members resemble bridges, the structures formed in the n-type pick-up area 130N or in the p-type pick-up area 130P may resemble multi-bridge-channel (MBC) transistors or gate-all-around (GAA) transistors. As will be described below, those structures in the n-type pick-up area 130N or in the p-type pick-up area 130P do not perform transistor functions and are therefore not wired like transistors.

Although not explicitly shown in the figures, the first implantation region 106N and the second implantation region 106P are formed using dummy gate stacks as an implantation masks. In an example process, after dummy gate stacks and gate spacers are formed over channel regions in, the ESD area 120, the ESD area 120 is selectively covered by a hard mask layer or a photoresist layer. With the hard mask layer covering the ESD area 120, the source/drain regions in the n-type pick-up area 130N, the p-type pick-up area 130P are recessed to form source/drain recesses. Sidewalls of the channel layers 12 and sacrificial layers 10 in the channel regions are exposed in the source/drain recesses. The exposed sacrificial layers 10 are then partially and selectively recessed to form inner spacer recesses. One or more dielectric layers are then deposited in the inner spacer recesses. After an etch back process, inner spacer features are formed in the inner spacer recesses. Source/drain features (or epitaxial features) are then deposited in the source/drain recesses using epitaxial processes. After the source/drain features in the n-type pick-up area 130N and the p-type pick-up area 130P are formed, the hard mask or photoresist layer over the ESD area 120 is removed. Implantation masks are then formed to selectively implant the first implantation region 106N and the second implantation region 106P. The implantation process may include a dose between about $4\times10^{13}$ atoms/$cm^2$ and about $6\times10^{13}$ atoms/$cm^2$. The dummy gate stacks and the gate spacer layer on the sidewalls thereof also serve as implantation mask to prevent the channel regions from being implanted. As a result, the n-type pick-up area 130N and the p-type pick-up area 130P include epitaxially grown source/drain features in source/drain regions but the ESD area 120 do not have epitaxially grown source/drain features.

As described above with respect to FIG. 1, the first implantation region 106N includes a first portion (on the left-hand side in FIG. 1) of the ESD area 120 and the entirety of the n-type pick-up area 130N and the second implantation region 106P includes a second portion (on the right-hand side in FIG. 1) of the ESD area 120 and the entirety of the p-type pick-up area 130P. As shown in FIG. 1, each of the first implantation region 106N and the second implantation region 106P has an L-shape. In some embodiments represented in FIG. 1, the L-shaped first implantation region 106N and the L-shaped second implantation region 106P are arranged in a reciprocating fashion such that the two L-shaped regions form a rectangle. The two interlocked L-shaped regions define the intrinsic portion 103 which, in an ideal case, may be free of dopant and serves as a buffer zone. In reality, the implantation process may not be perfectly clear cut and junction diffusion may take place. For that reason, backside metal lines of the present disclosure are purposely spaced apart from the vertical projection region of the intrinsic portion 103. The first implantation region 106N includes an n-type dopant, such as phosphorus (P) or arsenic (As). The second implantation region 106P includes a p-type dopant, such as boron (B) or boron difluoride ($BF_2$).

Figure 2:
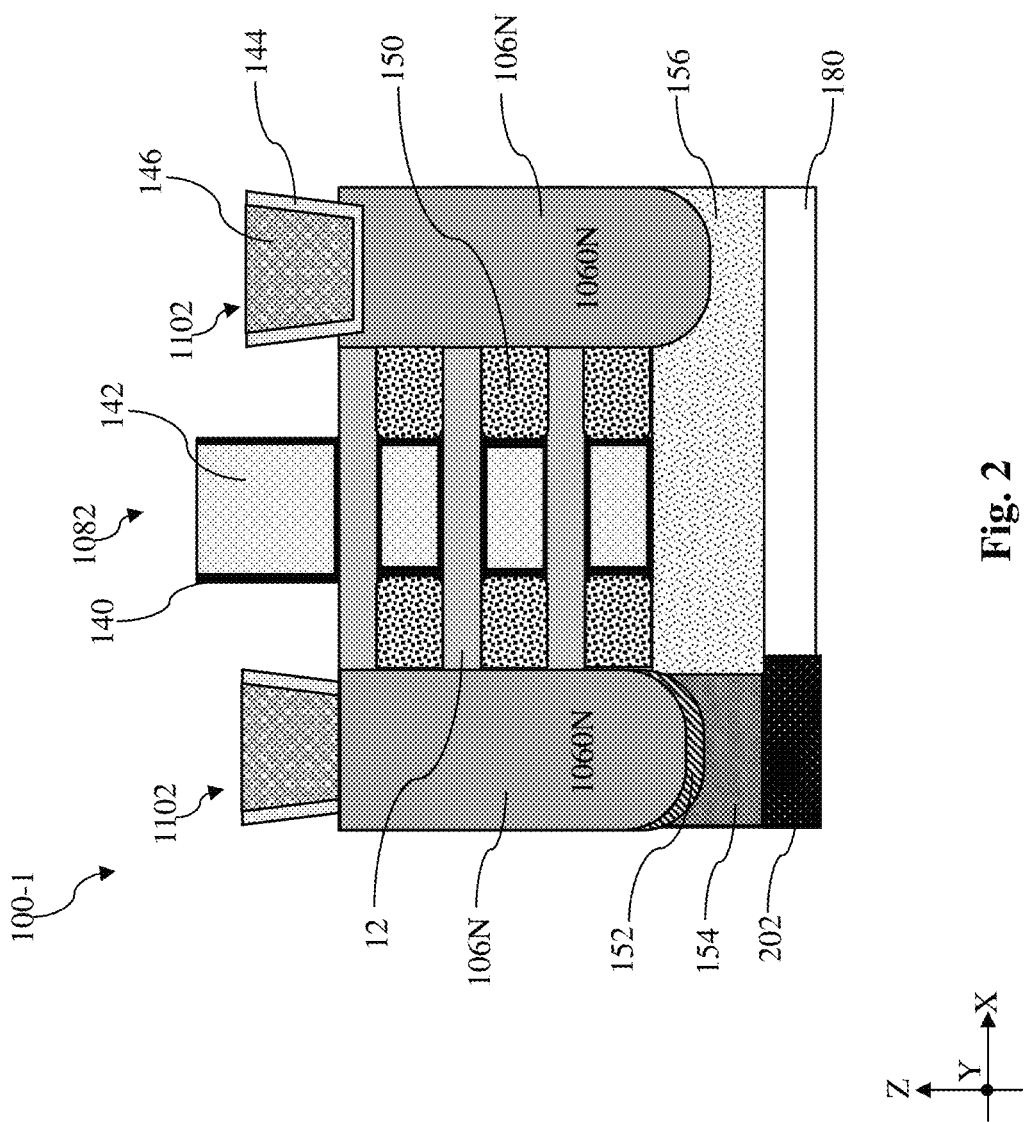
FIG. 2 is a fragmentary cross-sectional view of a semiconductor device in an n-type pick-up area of the semiconductor structure, according to various aspects of the present disclosure.

Reference is made to FIG. 2, which illustrates a fragmentary cross-sectional view of a first semiconductor device 100-1 in an n-type pick-up area 130N of the semiconductor structure 100. In some embodiments represented in FIG. 2, the first semiconductor device 100-1 is an MBC transistor that includes a plurality of bridge-like channel members released from the channel layers 12. An MBC transistor may be referred to as a gate-all-around (GAA) transistor or a surrounding gate transistor (SGT) as its gate structure wraps around each of the channel members (or channel structures). An MBC transistor may also be referred to as nanosheet transistor or a nanowire transistor because each of the bridge-like channel members is nanoscale and may resemble a wire or a sheet. The channel members 12 extend along the X direction between two n-type source/drain features 1060N. A first gate structure 1082 that extends lengthwise along the Y direction wraps around each of the plurality of channel members 12. As shown in FIG. 2, the first gate structure 1082 includes a gate dielectric layer 140 and a gate electrode 142. The first gate structure 1082 is isolated from the n-type source/drain features 1060N by a plurality of inner spacer features 150. A source/drain contact 1102 is disposed over and electrically coupled to each of the n-type source/drain features 1060N. In some implementations represented in FIG. 2, the source/drain contact 1102 includes a barrier layer 144 and a metal fill layer 146. As described above, the n-type source/drain features 1060N in the n-type pick-up area 130N are epitaxially formed in source/drain recesses and are also doped in the implantation process that forms the first implantation region 106N. For that reasons, the n-type source/drain features 1060N may be considered part of the first implantation region 106N.

In some embodiments, the channel members 12 may include a semiconductor material, such as silicon (Si). The gate dielectric layer 140 may include an interfacial layer and a high-k dielectric layer. In some embodiments, the interfacial layer may include a dielectric material such as silicon oxide layer or silicon oxynitride. The high-k dielectric layer is formed of a high-k (dielectric constant greater than about 3.9) dielectric material that may include hafnium oxide, titanium oxide, hafnium zirconium oxide, tantalum oxide, hafnium silicon oxide, zirconium oxide, zirconium silicon oxide, combinations thereof, or other suitable materials. The gate electrode 142 may include one or more work function layers and a metal fill layer. The one or more work function layers may include n-type work function layers and/or p-type work function layers. Example n-type work function layers may be formed of aluminum, titanium aluminide, titanium aluminum carbide, tantalum silicon carbide, tantalum silicon aluminum, tantalum silicide, or hafnium carbide. Example p-type work function layers may be formed of titanium nitride, titanium silicon nitride, tantalum nitride, tungsten carbonitride, or molybdenum. The metal fill layer may be formed of a metal, such as tungsten (W), ruthenium (Ru), cobalt (Co) or copper (Cu).

In some embodiments, the inner spacer features 150 include silicon oxide, hafnium silicide, silicon oxycarbide, aluminum oxide, zirconium silicide, aluminum oxynitride, zirconium oxide, hafnium oxide, titanium oxide, zirconium aluminum oxide, zinc oxide, tantalum oxide, lanthanum oxide, yttrium oxide, tantalum carbonitride, silicon nitride, silicon oxycarbonitride, silicon, zirconium nitride, or silicon carbonitride. The metal fill layer 146 for the source/drain contact 1102 may be formed of tungsten (W), ruthenium (Ru), cobalt (Co), nickel (Ni), or copper (Cu). The barrier layer 144 may be formed of titanium nitride (TiN), tantalum nitride (TaN), titanium (Ti), molybdenum (Mo), cobalt nitride (CoN), tungsten nitride (WN), or titanium silicon nitride (TiSiN).

As shown in FIG. 2, one the n-type source/drain features 1060N is coupled to a backside power rail 202 by way of a silicide layer 152 and a backside contact via 154. The silicide layer 152 functions to reduce contact resistance. The first gate structure 1082 and the other n-type source/drain feature 1060N are disposed over a backside dielectric layer 156. The silicide layer 152 may include titanium silicide (TiSi), nickel silicide (NiSi), cobalt silicide (CoSi), or titanium silicon nitride (TiSiN). The backside contact via 154 may be formed of tungsten (W), titanium (Ti), titanium nitride (TiN), ruthenium (Ru), cobalt (Co), nickel (Ni), or copper (Cu). The backside dielectric layer 156 may include silicon oxide, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The backside power rail 202 is embedded in an insulation layer 180, which may be similar to the backside dielectric layer 156 in terms of composition.

Figure 3:
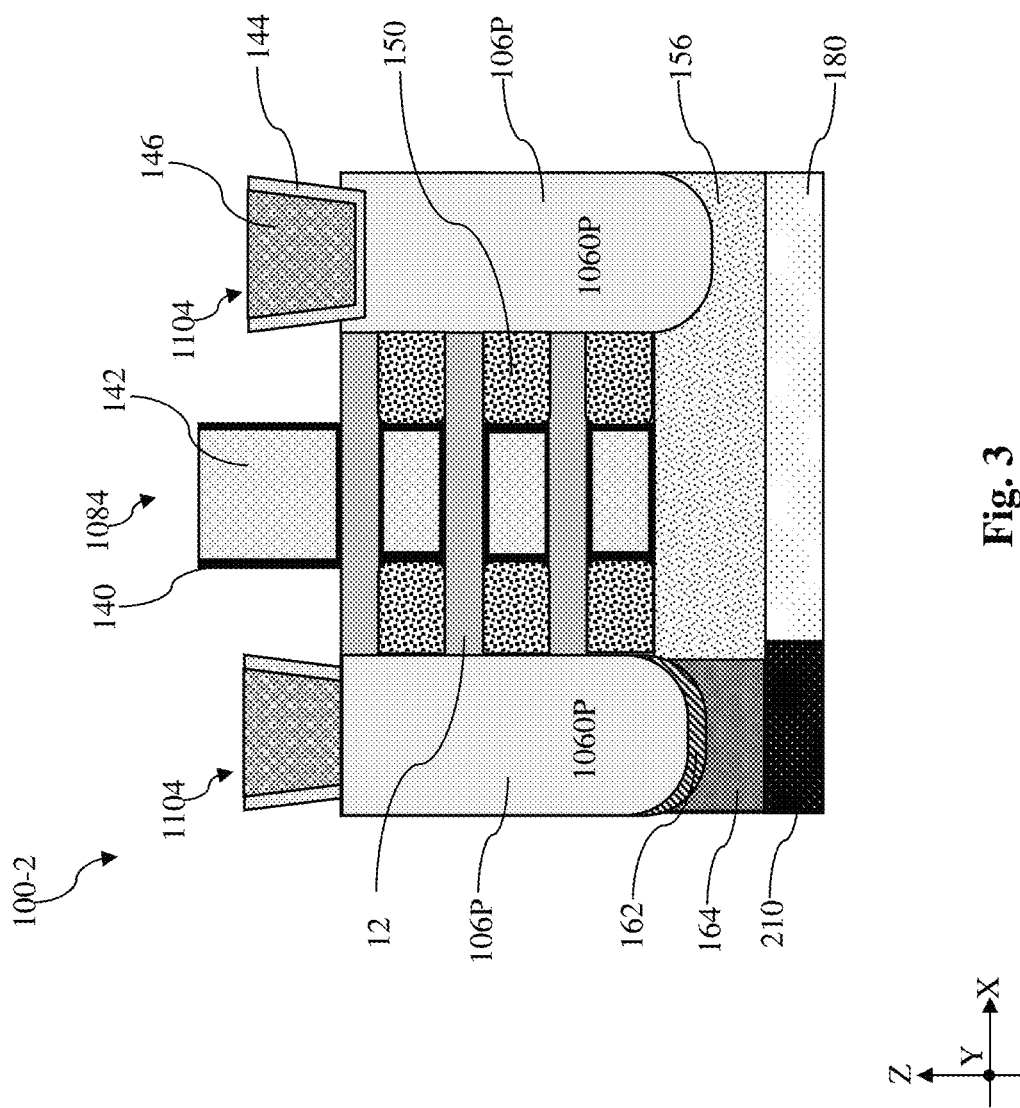
FIG. 3 is a fragmentary cross-sectional view of a semiconductor device in a p-type pick-up area of the semiconductor structure, according to various aspects of the present disclosure.

Reference is made to FIG. 3, which illustrates a fragmentary cross-sectional view of a second semiconductor device 100-2 in a p-type pick-up area 130P of the semiconductor structure 100. In some embodiments represented in FIG. 3, the second semiconductor device 100-2 is also an MBC transistor that includes a plurality of bridge-like channel members released from the channel layers 12. The channel members 12 extend along the X direction between two p-type source/drain features 1060P. A second gate structure 1084 that extends lengthwise along the Y direction wraps around each of the plurality of channel members 12 in the channel region of the third active region 104-3 or the fourth active region 104-4. As shown in FIG. 3, the second gate structure 1084 also includes a gate dielectric layer 140 and a gate electrode 142. The second gate structure 1084 is isolated from the p-type source/drain features 1060P by a plurality of inner spacer features 150. A source/drain contact 1104 is disposed over and electrically coupled to each of the p-type source/drain features 1060P. In some implementations represented in FIG. 3, the source/drain contact 1104 includes a barrier layer 144 and a metal fill layer 146. As described above, the p-type source/drain features 1060P in the p-type pick-up area 130P are epitaxially formed in source/drain recesses and are also doped in the implantation process that forms the second implantation region 106P. For that reason, the p-type source/drain features 1060P are part of the second implantation region 106P as well.

The channel members 12 may include a semiconductor material, such as silicon (Si). The gate dielectric layer 140 may include an interfacial layer and a high-k dielectric layer. In some embodiments, the interfacial layer may include a dielectric material such as silicon oxide layer or silicon oxynitride. The high-k dielectric layer is formed of a high-k (dielectric constant greater than about 3.9) dielectric material that may include hafnium oxide, titanium oxide, hafnium zirconium oxide, tantalum oxide, hafnium silicon oxide, zirconium oxide, zirconium silicon oxide, combinations thereof, or other suitable materials. The gate electrode 142 may include one or more work function layers and a metal fill layer. The one or more work function layers may include n-type work function layers and p-type work function layers. Example n-type work function layers may be formed of aluminum, titanium aluminide, titanium aluminum carbide, tantalum silicon carbide, tantalum silicon aluminum, tantalum silicide, or hafnium carbide. Example p-type work function layers may be formed of titanium nitride, titanium silicon nitride, tantalum nitride, tungsten carbonitride, or molybdenum. The metal fill layer may be formed of a metal, such as tungsten (W), ruthenium (Ru), cobalt (Co) or copper (Cu).

In some embodiments, the inner spacer features 150 include silicon oxide, hafnium silicide, silicon oxycarbide, aluminum oxide, zirconium silicide, aluminum oxynitride, zirconium oxide, hafnium oxide, titanium oxide, zirconium aluminum oxide, zinc oxide, tantalum oxide, lanthanum oxide, yttrium oxide, tantalum carbonitride, silicon nitride, silicon oxycarbonitride, silicon, zirconium nitride, or silicon carbonitride. The metal fill layer 146 for the source/drain contact 1104 may be formed of tungsten (W), ruthenium (Ru), cobalt (Co), nickel (Ni), or copper (Cu). The barrier layer 144 may be formed of titanium nitride (TiN), tantalum nitride (TaN), titanium (Ti), molybdenum (Mo), cobalt nitride (CoN), tungsten nitride (WN), or titanium silicon nitride (TiSiN).

As shown in FIG. 3, one the p-type source/drain features 1060P is coupled to a backside power rail 210 by way of a silicide layer 162 and a backside contact via 164. The silicide layer 162 functions to reduce contact resistance. The second gate structure 1084 and the other p-type source/drain feature 1060P are disposed over the backside dielectric layer 156. The silicide layer 162 may include titanium silicide (TiSi), nickel silicide (NiSi), cobalt silicide (CoSi), or titanium silicon nitride (TiSiN). The backside contact via 164 may be formed of tungsten (W), titanium (Ti), titanium nitride (TiN), ruthenium (Ru), cobalt (Co), nickel (Ni), or copper (Cu). The backside dielectric layer 156 may include silicon oxide, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The backside power rail 210 is embedded in the insulation layer 180, which may be similar to the backside dielectric layer 156 in terms of composition.

Reference is made to FIG. 4, which illustrates a fragmentary cross-sectional view of a third semiconductor device 100-3 in the ESD area 120 disposed between the n-type pick-up area 130N and the p-type pick-up area 130P. In some embodiments represented in FIG. 4, the third semiconductor device 100-3 resembles a fin-type field effect transistor (finFET) and has a fin that includes a plurality of channel layers 12 interleaved by a plurality of sacrificial layers 10. Different from the first semiconductor device 100-1 and the second semiconductor device 100-2, the sacrificial layers 10 in the wide active region 104E are not selectively removed. That is, the channel layers 12 in the wide active region 104E are not released as channel members. No source/drain recesses are formed in the wide active region 104E and no epitaxial source/drain features are formed over the source/drain regions. Instead, the source/drain regions of the wide active region 104E are ion-implanted such that one is part of the first implantation region 106N and the other becomes a part of the second implantation region 106P. In the embodiment depicted in FIG. 4, a bottom edge of the first implantation region 106N or the second implantation region 106P does not extend all the way through the substrate 102 and is at least a distance D from a bottom surface of the substrate 102. The distance D is selected to ensure that no n-type or p-type dopants may diffuse through the substrate 102 during the subsequent thermal or annealing processes. In some instances, the distance D may be between about 30 nm and about 50 nm. The floating gate structure 108E that spans over the wide active region 104E includes a gate dielectric layer 140 and a gate electrode 142. An ESD source/drain contact 110E is disposed over each of the source/drain regions. In some implementations represented in FIG. 4, the ESD source/drain contacts 110E include a barrier layer 144 and a metal fill layer 146.

The floating gate structure 108E includes a gate dielectric layer 140 and a gate electrode 142. The gate dielectric layer 140 may include an interfacial layer and a high-k dielectric layer. In some embodiments, the interfacial layer may include a dielectric material such as silicon oxide layer or silicon oxynitride. The high-k dielectric layer is formed of a high-k (dielectric constant greater than about 3.9) dielectric material that may include hafnium oxide, titanium oxide, hafnium zirconium oxide, tantalum oxide, hafnium silicon oxide, zirconium oxide, zirconium silicon oxide, combinations thereof, or other suitable materials. The gate electrode 142 may include one or more work function layers and a metal fill layer. The one or more work function layers may include n-type work function layers and/or p-type work function layers. Example n-type work function layers may be formed of aluminum, titanium aluminide, titanium aluminum carbide, tantalum silicon carbide, tantalum silicon aluminum, tantalum silicide, or hafnium carbide. Example p-type work function layers may be formed of titanium nitride, titanium silicon nitride, tantalum nitride, tungsten carbonitride, or molybdenum. The metal fill layer may be formed of a metal, such as tungsten (W), ruthenium (Ru), cobalt (Co) or copper (Cu).

The metal fill layer 146 for the ESD source/drain contacts 110E may be formed of tungsten (W), ruthenium (Ru), cobalt (Co), nickel (Ni), or copper (Cu). The barrier layer 144 may be formed of titanium nitride (TiN), tantalum nitride (TaN), titanium (Ti), molybdenum (Mo), cobalt nitride (CoN), tungsten nitride (WN), or titanium silicon nitride (TiSiN).

The third semiconductor device 100-3 includes a backside metal line 206 is embedded in the insulation layer 180. Because the bottom edges of the first implantation region 106N and the second implantation region 106P are at least the distance D away from the backside metal line 206, neither of the first implantation region 106N nor the second implantation region 106P may be shorted to the backside metal line 206 no matter where the backside metal line 206 is placed. As shown in FIG. 4, the floating gate structure 108E of the third semiconductor device 100-3 is disposed in the intrinsic portion 103, one source/drain region falls within the first implantation region 106N and the other source/drain region falls within the second implantation region 106P.

In the embodiment represented in FIG. 4, the third semiconductor device 100-3 is ESD diode or a lateral diode that serves to protect the ICs from ESD damages. For the third semiconductor device 100-3 to function as an ESD diode, the source/drain region that is part of the first implantation region 106N is connected as a cathode (C) and the source/drain region that is part of the second implantation region 106P is connected as an anode (A). A p-n junction or a depletion region is present in the intrinsic portion 103. When a sufficiently high electrical potential is applied between the anode and the cathode, electrons may flow from the first implantation region 106N through the depletion region to the second implantation region 106P. In other words, current may flow from the second implantation region 106P to the first implantation region 106N as shown by the arrows in FIG. 4. Because the implantation regions are at least the distance D away from the bottom surface of the semiconductor substrate 102, this current flow may not take place in the semiconductor substrate 102. That is why the presence of any backside metal line immediately below the semiconductor substrate 102 does not affect the operation of the third semiconductor device 100-3 as an ESD diode.

Figure 5:
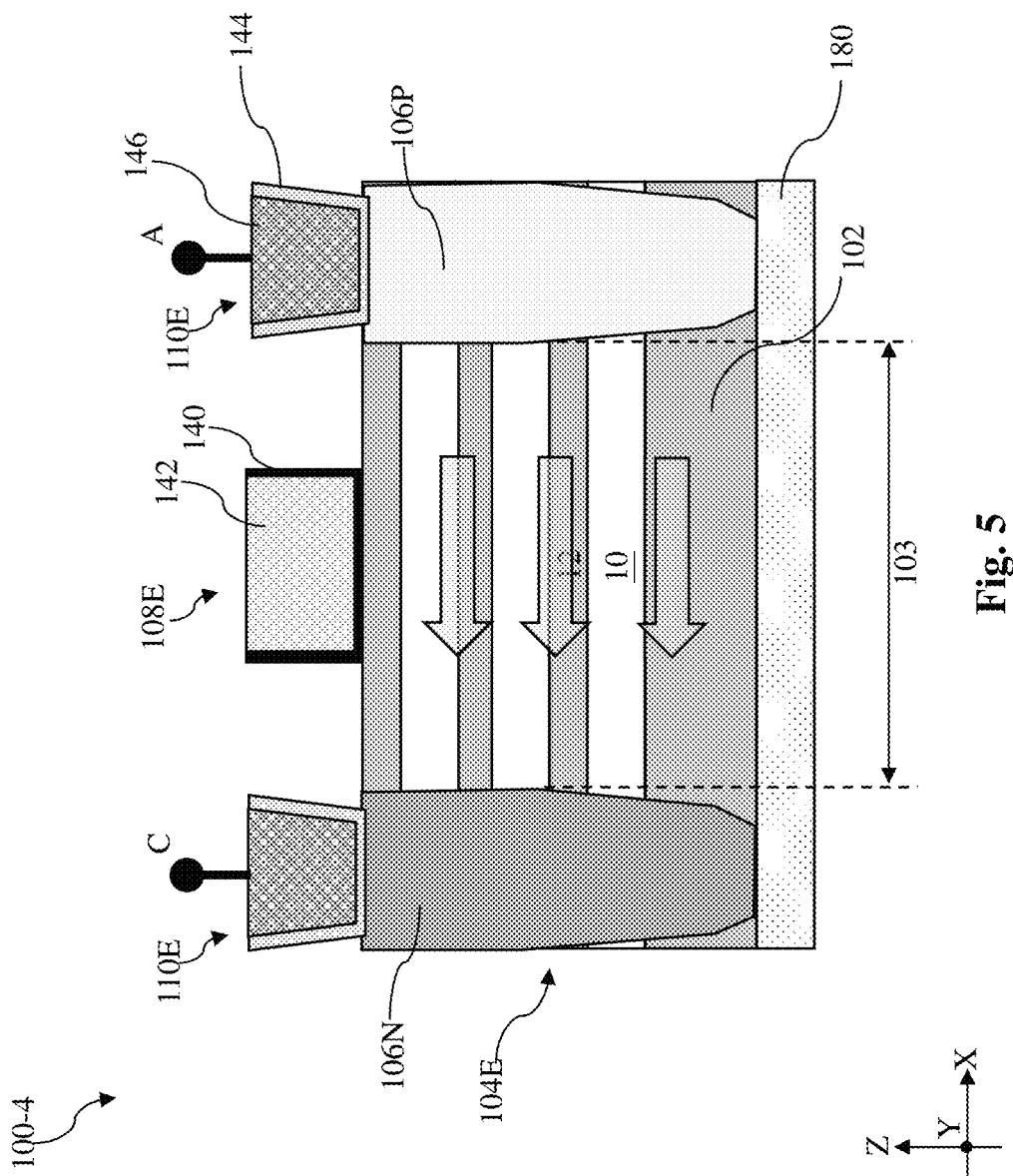

Reference is made to FIG. 5, which illustrates a fragmentary cross-sectional view of a fourth semiconductor device100-4 in the ESD area 120 disposed between the n-type pick-up area 130N and the p-type pick-up area 130P. In some embodiments represented in FIG. 5, the fourth semiconductor device 100-4 resembles a finFET and has a fin that includes a plurality of channel layers 12 interleaved by a plurality of sacrificial layers 10. Different from the first semiconductor device 100-1 and the second semiconductor device 100-2, the sacrificial layers 10 in the wide active region 104E are not selectively removed. That is, the channel layers 12 are not released as channel members. No source/drain recesses are formed in the wide active region 104E and no epitaxial source/drain features are formed over the source/drain regions. Instead, the source/drain regions of the wide active region 104E are ion-implanted such that one source/drain region becomes part of the first implantation region 106N and the other source/drain region becomes part of the second implantation region 106P. In the embodiment depicted in FIG. 5, the first implantation region 106N and the second implantation region 106P extend all the way through the wide active region 104E and the substrate 102.

While the fourth semiconductor device 100-4 includes the insulation layer 180 on a back surface of the substrate 102, no backside metal line may be disposed directly below the source/drain regions or the floating gate structure. This is so because such a backside metal line may create risks of electrical short between the first implantation region 106N and the second implantation region 106P. For example, when a hypothetical backside metal line is disposed below the first implantation region 106N but not sufficiently apart from the intrinsic portion 103, diffusion edge in the intrinsic portion 103 may cause shorts. When a hypothetical backside metal line spans across the intrinsic portion 103, the hypothetical metal line may cause shorts. When a hypothetical backside metal line is disposed below the second implantation region 106P but not sufficiently apart from the intrinsic portion 103, diffusion edge in the intrinsic portion 103 may cause shorts. The floating gate structure 108E that spans over the wide active region 104E includes a gate dielectric layer 140 and a gate electrode 142. An ESD source/drain contact 110E is disposed over each of the first implantation region 106N and the second implantation region 106P. In some implementations represented in FIG. 5, the ESD source/drain contacts 110E include a barrier layer 144 and a metal fill layer 146.

The floating gate structure 108E includes a gate dielectric layer 140 and a gate electrode 142. The gate dielectric layer 140 may include an interfacial layer and a high-k dielectric layer. In some embodiments, the interfacial layer may include a dielectric material such as silicon oxide layer or silicon oxynitride. The high-k dielectric layer is formed of a high-k (dielectric constant greater than about 3.9) dielectric material that may include hafnium oxide, titanium oxide, hafnium zirconium oxide, tantalum oxide, hafnium silicon oxide, zirconium oxide, zirconium silicon oxide, combinations thereof, or other suitable materials. The gate electrode 142 may include one or more work function layers and a metal fill layer. The one or more work function layers may include n-type work function layers and/or p-type work function layers. Example n-type work function layers may be formed of aluminum, titanium aluminide, titanium aluminum carbide, tantalum silicon carbide, tantalum silicon aluminum, tantalum silicide, or hafnium carbide. Example p-type work function layers may be formed of titanium nitride, titanium silicon nitride, tantalum nitride, tungsten carbonitride, or molybdenum. The metal fill layer may be formed of a metal, such as tungsten (W), ruthenium (Ru), cobalt (Co) or copper (Cu).

The metal fill layer 146 for the ESD source/drain contacts 110E may be formed of tungsten (W), ruthenium (Ru), cobalt (Co), nickel (Ni), or copper (Cu). The barrier layer 144 may be formed of titanium nitride (TiN), tantalum nitride (TaN), titanium (Ti), molybdenum (Mo), cobalt nitride (CoN), tungsten nitride (WN), or titanium silicon nitride (TiSiN).

In the embodiment represented in FIG. 5, the fourth semiconductor device 100-4 is ESD diode or a lateral diode that serves to protect the ICs from ESD damages. For the fourth semiconductor device 100-4 to function as an ESD diode, the source/drain region that is part of the first implantation region 106N is connected as a cathode terminal and the source/drain region that is part of the second implantation region 106P is connected as an anode terminal. A p-n junction or a depletion region is present in the intrinsic portion 103. When a sufficiently high electrical potential is applied between the anode and the cathode, electrons may flow from the first implantation region 106N through the depletion region to the second implantation region 106P. In other words, current may flow from the second implantation region 106P to the first implantation region 106N as shown by the arrows in FIG. 5. Because the implantation regions extend all the way through the wide active region 104E and the semiconductor substrate 102, this current flow may take place in the wide active region 104E as well as in the semiconductor substrate 102. That is why the presence of backside metal line immediately below the semiconductor substrate 102 may create risks of failures to the fourth semiconductor device 100-4 serving as an ESD diode.

Figure 6:
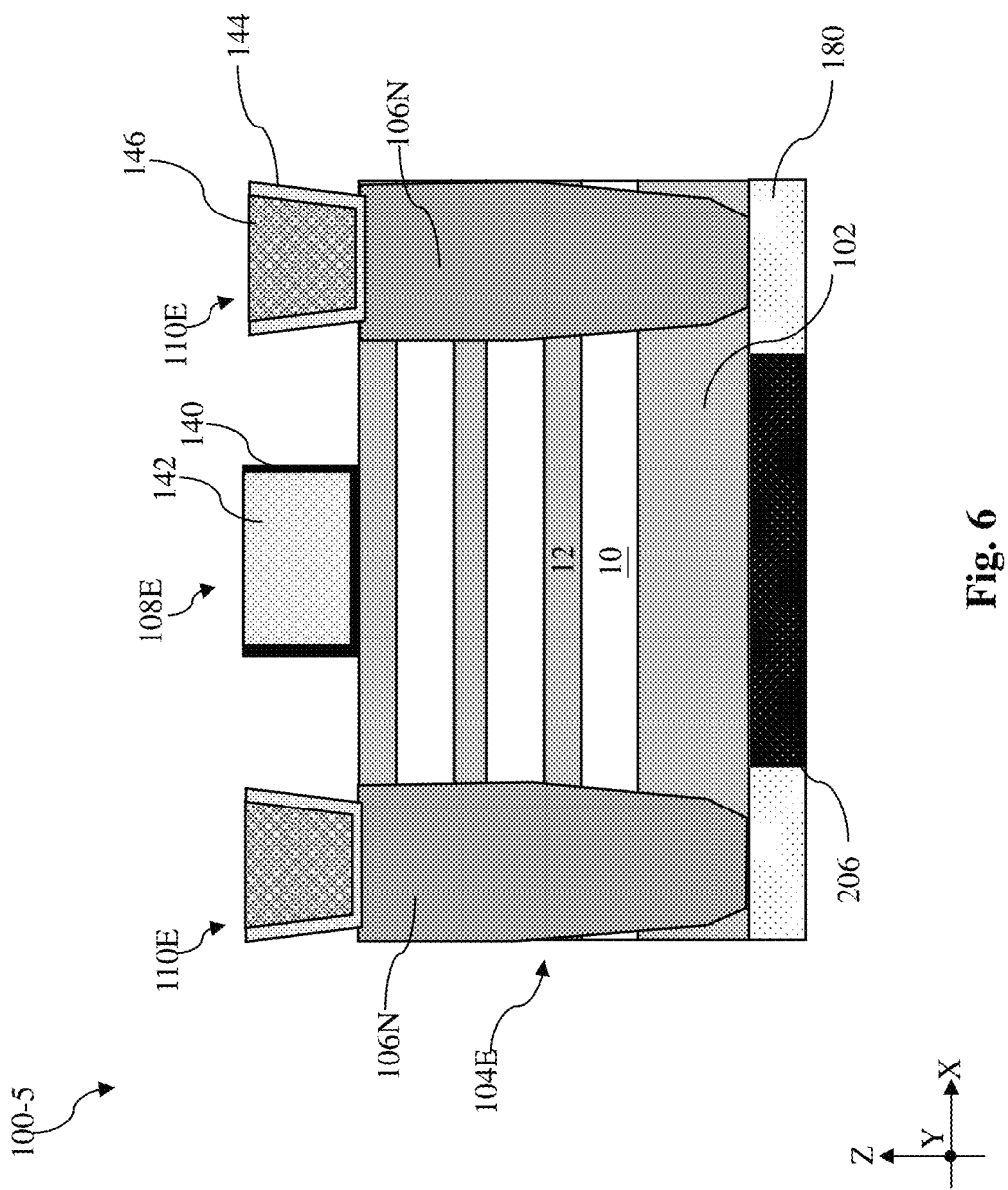

Reference is made to FIG. 6, which illustrates a fragmentary cross-sectional view of a fifth semiconductor device 100-5 in the ESD area 120 disposed between the n-type pick-up area 130N and the p-type pick-up area 130P. In some embodiments represented in FIG. 6, the fifth semiconductor device 100-5 resembles a finFET and has a fin that includes a plurality of channel layers 12 interleaved by a plurality of sacrificial layers 10. Different from the first semiconductor device 100-1 and the second semiconductor device 100-2, the sacrificial layers 10 in the wide active region 104E are not selectively removed. That is, the channel layers 12 are not released as channel members. No source/drain recesses are formed in the wide active region 104E and no epitaxial source/drain features are formed over the source/drain regions. Instead, the source/drain regions of the wide active region 104E are ion-implanted to become part of the first implantation region 106N. In the embodiment depicted in FIG. 6, the first implantation region 106N extends all the way through the wide active region 104E and the substrate 102. The floating gate structure 108E that spans over the wide active region 104E includes a gate dielectric layer 140 and a gate electrode 142. An ESD source/drain contact 110E is disposed over each of the source/drain regions. In some implementations represented in FIG. 6, the ESD source/drain contacts 110E include a barrier layer 144 and a metal fill layer 146.

The floating gate structure 108E includes a gate dielectric layer 140 and a gate electrode 142. The gate dielectric layer 140 may include an interfacial layer and a high-k dielectric layer. In some embodiments, the interfacial layer may include a dielectric material such as silicon oxide layer or silicon oxynitride. The high-k dielectric layer is formed of a high-k (dielectric constant greater than about 3.9) dielectric material that may include hafnium oxide, titanium oxide, hafnium zirconium oxide, tantalum oxide, hafnium silicon oxide, zirconium oxide, zirconium silicon oxide, combinations thereof, or other suitable materials. The gate electrode 142 may include one or more work function layers and a metal fill layer. The one or more work function layers may include n-type work function layers and/or p-type work function layers. Example n-type work function layers may be formed of aluminum, titanium aluminide, titanium aluminum carbide, tantalum silicon carbide, tantalum silicon aluminum, tantalum silicide, or hafnium carbide. Example p-type work function layers may be formed of titanium nitride, titanium silicon nitride, tantalum nitride, tungsten carbonitride, or molybdenum. The metal fill layer may be formed of a metal, such as tungsten (W), ruthenium (Ru), cobalt (Co) or copper (Cu). The metal fill layer 146 for the ESD source/drain contacts 110E may be formed of tungsten (W), ruthenium (Ru), cobalt (Co), nickel (Ni), or copper (Cu). The barrier layer 144 may be formed of titanium nitride (TiN), tantalum nitride (TaN), titanium (Ti), molybdenum (Mo), cobalt nitride (CoN), tungsten nitride (WN), or titanium silicon nitride (TiSiN).

The fifth semiconductor device 100-5 includes the insulation layer 180 on a back surface of the substrate 102 and a backside metal line 206 is embedded in the insulation layer 180. In the depicted embodiment, the backside metal line 206 is disposed directly below the floating gate structure 108E. Because the backside metal line 206 is completely enclosed in the first implantation region 106N (both the source/drain regions fall in the first implantation region 106N) and sufficiently spaced apart from the intrinsic portion 103, the backside metal line 206 does not create risks of shorts and the fifth semiconductor device 100-5 may function as an ESD diode or ESD protection device. The locational constraints of the backside metal line 206 will be described in more details in conjunction with FIGS. 10 and 11.

Figure 7:
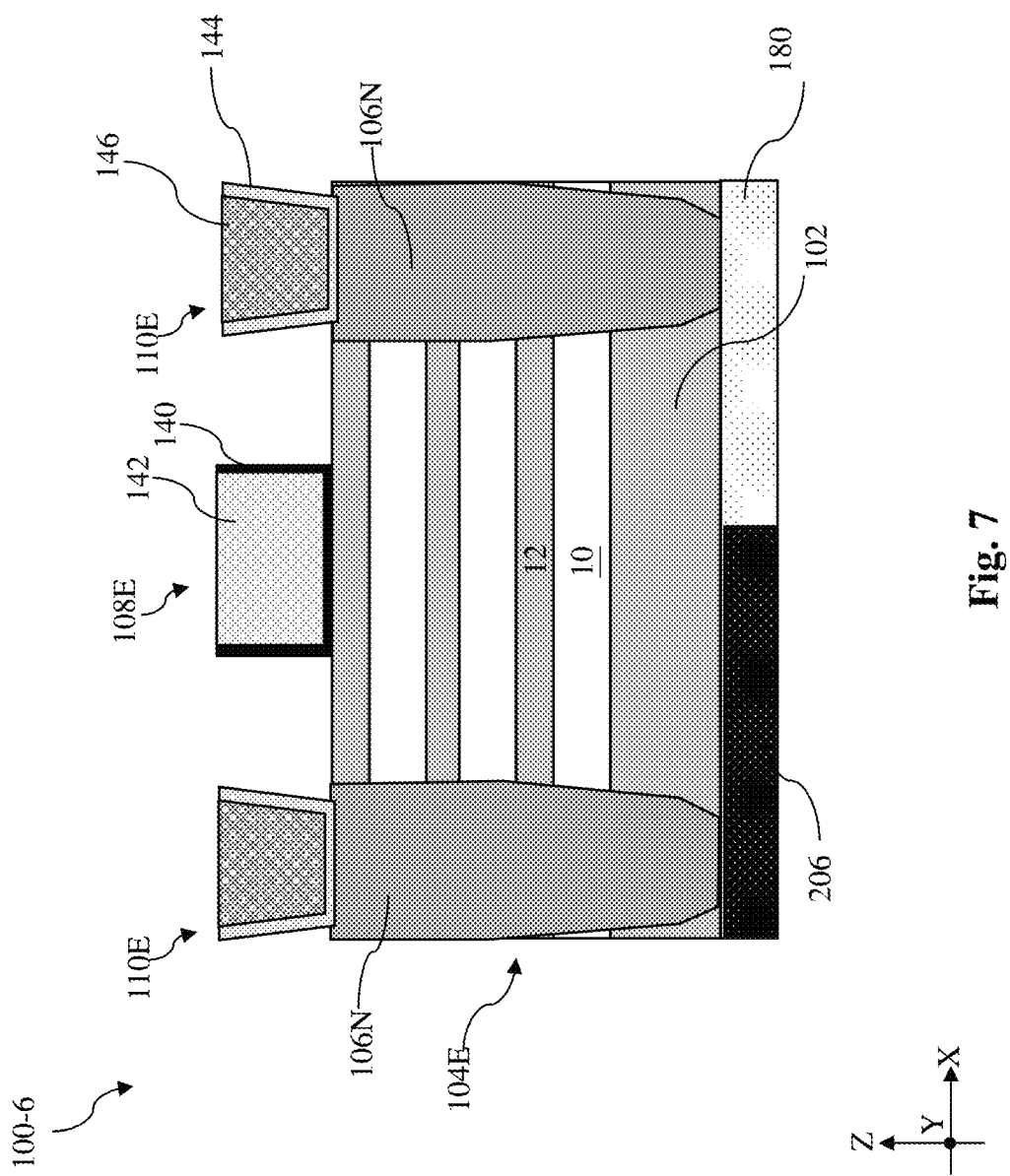

Reference is made to FIG. 7, which illustrates a fragmentary cross-sectional view of a sixth semiconductor device 100-6 in the ESD area 120 disposed between the n-type pick-up area 130N and the p-type pick-up area 130P. In some embodiments represented in FIG. 7, the sixth semiconductor device 100-6 resembles a finFET and has a fin that includes a plurality of channel layers 12 interleaved by a plurality of sacrificial layers 10. Different from the first semiconductor device 100-1 and the second semiconductor device 100-2, the sacrificial layers 10 in the wide active region 104E are not selectively removed. That is, the channel layers 12 are not released as channel members. No source/drain recesses are formed in the wide active region 104E and no epitaxial source/drain features are formed over the source/drain regions. Instead, the source/drain regions of the wide active region 104E are ion-implanted to be part of the first implantation region 106N. In the embodiment depicted in FIG. 7, the first implantation region 106N extends all the way downward through the wide active region 104E and the substrate 102. The floating gate structure 108E that spans over the wide active region 104E includes a gate dielectric layer 140 and a gate electrode 142. An ESD source/drain contact 110E is disposed over the source/drain regions that are part of the first implantation region 106N. In some implementations represented in FIG. 7, the ESD source/drain contacts 110E include a barrier layer 144 and a metal fill layer 146.

The floating gate structure 108E includes a gate dielectric layer 140 and a gate electrode 142. The gate dielectric layer 140 may include an interfacial layer and a high-k dielectric layer. In some embodiments, the interfacial layer may include a dielectric material such as silicon oxide layer or silicon oxynitride. The high-k dielectric layer is formed of a high-k (dielectric constant greater than about 3.9) dielectric material that may include hafnium oxide, titanium oxide, hafnium zirconium oxide, tantalum oxide, hafnium silicon oxide, zirconium oxide, zirconium silicon oxide, combinations thereof, or other suitable materials. The gate electrode 142 may include one or more work function layers and a metal fill layer. The one or more work function layers may include n-type work function layers and/or p-type work function layers. Example n-type work function layers may be formed of aluminum, titanium aluminide, titanium aluminum carbide, tantalum silicon carbide, tantalum silicon aluminum, tantalum silicide, or hafnium carbide. Example p-type work function layers may be formed of titanium nitride, titanium silicon nitride, tantalum nitride, tungsten carbonitride, or molybdenum. The metal fill layer may be formed of a metal, such as tungsten (W), ruthenium (Ru), cobalt (Co) or copper (Cu). The metal fill layer 146 for the ESD source/drain contacts 110E may be formed of tungsten (W), ruthenium (Ru), cobalt (Co), nickel (Ni), or copper (Cu). The barrier layer 144 may be formed of titanium nitride (TiN), tantalum nitride (TaN), titanium (Ti), molybdenum (Mo), cobalt nitride (CoN), tungsten nitride (WN), or titanium silicon nitride (TiSiN).

The sixth semiconductor device 100-6 includes the insulation layer 180 on a back surface of the substrate 102 and a backside metal line 206 is embedded in the insulation layer 180. In the depicted embodiment, the backside metal line 206 is disposed directly below one of the source/drain regions. Because the backside metal line 206 is completely enclosed in the first implantation region 106N and sufficiently spaced apart from the intrinsic portion 103, the backside metal line 206 does not create risks of shorts and the sixth semiconductor device 100-6 may function as an ESD diode or ESD protection device. The locational constraints of the backside metal line 206 will be described in more details in conjunction with FIGS. 10 and 11.

Figure 8:
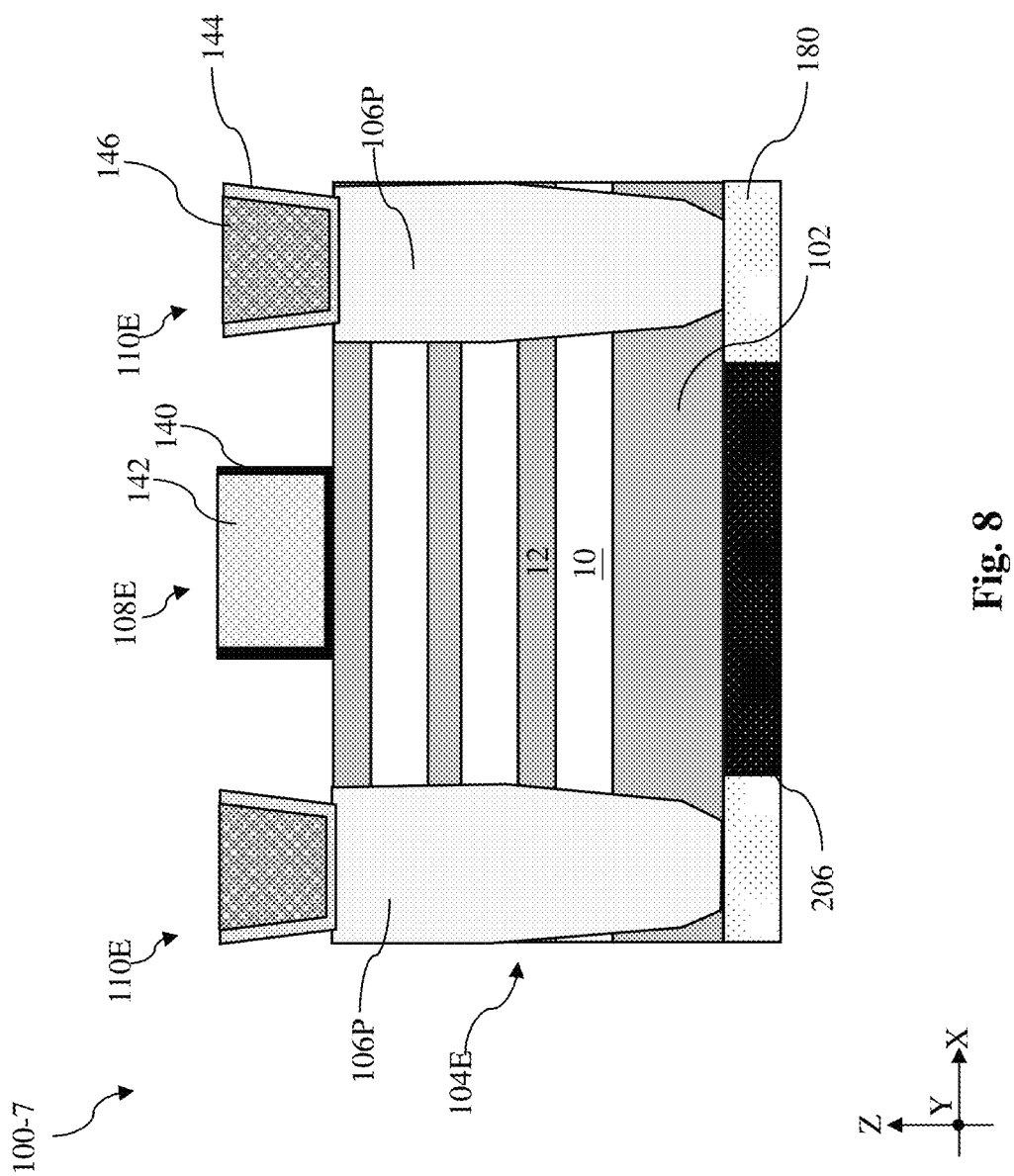

Reference is made to FIG. 8, which illustrates a fragmentary cross-sectional view of a seventh semiconductor device 100-7 in the ESD area 120 disposed between the n-type pick-up area 130N and the p-type pick-up area 130P. In some embodiments represented in FIG. 8, the seventh semiconductor device 100-7 resembles a finFET and has a fin that includes a plurality of channel layers 12 interleaved by a plurality of sacrificial layers 10. Different from the first semiconductor device 100-1 and the second semiconductor device 100-2, the sacrificial layers 10 in the wide active region 104E are not selectively removed. That is, the channel layers 12 are not released as channel members. No source/drain recesses are formed in the wide active region 104E and no epitaxial source/drain features are formed over the source/drain regions. Instead, the source/drain regions of the wide active region 104E are ion-implanted to be part of the second implantation region 106P. The floating gate structure 108E that spans over the wide active region 104E includes a gate dielectric layer 140 and a gate electrode 142. An ESD source/drain contact 110E is disposed over the ion implanted source/drain regions. In some implementations represented in FIG. 8, the ESD source/drain contacts 110E include a barrier layer 144 and a metal fill layer 146.

The floating gate structure 108E includes a gate dielectric layer 140 and a gate electrode 142. The gate dielectric layer 140 may include an interfacial layer and a high-k dielectric layer. In some embodiments, the interfacial layer may include a dielectric material such as silicon oxide layer or silicon oxynitride. The high-k dielectric layer is formed of a high-k (dielectric constant greater than about 3.9) dielectric material that may include hafnium oxide, titanium oxide, hafnium zirconium oxide, tantalum oxide, hafnium silicon oxide, zirconium oxide, zirconium silicon oxide, combinations thereof, or other suitable materials. The gate electrode 142 may include one or more work function layers and a metal fill layer. The one or more work function layers may include n-type work function layers and/or p-type work function layers. Example n-type work function layers may be formed of aluminum, titanium aluminide, titanium aluminum carbide, tantalum silicon carbide, tantalum silicon aluminum, tantalum silicide, or hafnium carbide. Example p-type work function layers may be formed of titanium nitride, titanium silicon nitride, tantalum nitride, tungsten carbonitride, or molybdenum. The metal fill layer may be formed of a metal, such as tungsten (W), ruthenium (Ru), cobalt (Co) or copper (Cu). The metal fill layer 146 for the ESD source/drain contacts 110E may be formed of tungsten (W), ruthenium (Ru), cobalt (Co), nickel (Ni), or copper (Cu). The barrier layer 144 may be formed of titanium nitride (TiN), tantalum nitride (TaN), titanium (Ti), molybdenum (Mo), cobalt nitride (CoN), tungsten nitride (WN), or titanium silicon nitride (TiSiN).

The seventh semiconductor device 100-7 includes the insulation layer 180 on a back surface of the substrate 102 and a backside metal line 206 is embedded in the insulation layer 180. In the depicted embodiment, the backside metal line 206 is disposed directly below the floating gate structure 108E. Because the backside metal line 206 is completely enclosed in the second implantation region 106P and sufficiently spaced apart from the intrinsic portion 103, the backside metal line 206 does not create risks of shorts and the seventh semiconductor device 100-7 may function as an ESD diode or ESD protection device. The locational constraints of the backside metal line 206 will be described in more details in conjunction with FIGS. 10 and 11.

Figure 9:
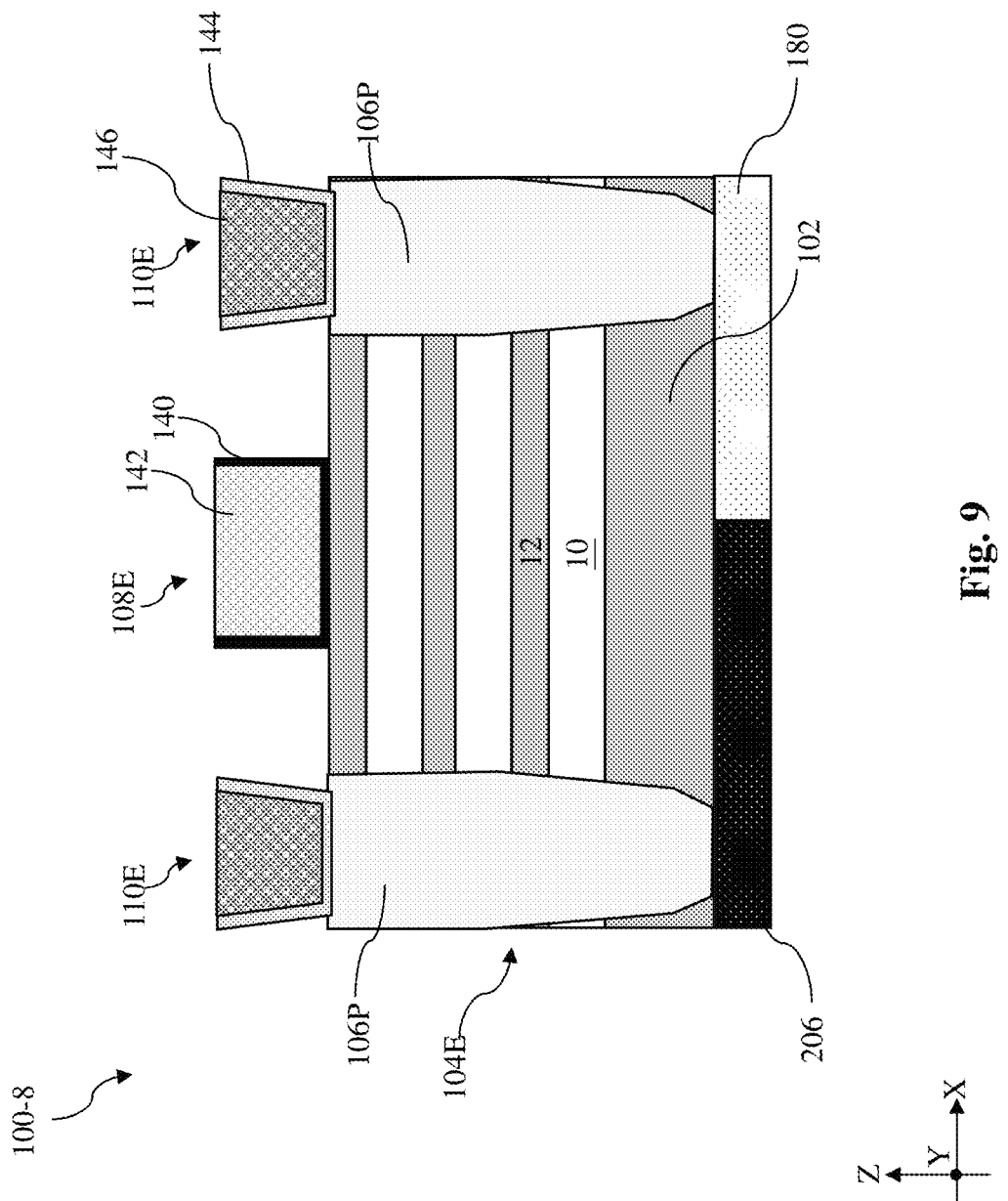

Reference is made to FIG. 9, which illustrates a fragmentary cross-sectional view of an eighth semiconductor device 100-8 in the ESD area 120 disposed between the n-type pick-up area 130N and the p-type pick-up area 130P. In some embodiments represented in FIG. 9, the eighth semiconductor device 100-8 resembles a finFET and has a fin that includes a plurality of channel layers 12 interleaved by a plurality of sacrificial layers 10. Different from the first semiconductor device 100-1 and the second semiconductor device 100-2, the sacrificial layers 10 in the wide active region 104E are not selectively removed. That is, the channel layers 12 are not released as channel members. No source/drain recesses are formed in the wide active region 104E and no epitaxial source/drain features are formed over the source/drain regions. Instead, the source/drain regions of the wide active region 104E are ion-implanted to become part of the second implantation region 106P. In the embodiment depicted in FIG. 9, the second implantation region 106P extends all the way through the wide active region 104E and the substrate 102. The floating gate structure 108E that spans over the wide active region 104E includes a gate dielectric layer 140 and a gate electrode 142. An ESD source/drain contact 110E is disposed over of each of the source/drain regions. In some implementations represented in FIG. 9, the ESD source/drain contacts 110E include a barrier layer 144 and a metal fill layer 146.

The floating gate structure 108E includes a gate dielectric layer 140 and a gate electrode 142. The gate dielectric layer 140 may include an interfacial layer and a high-k dielectric layer. In some embodiments, the interfacial layer may include a dielectric material such as silicon oxide layer or silicon oxynitride. The high-k dielectric layer is formed of a high-k (dielectric constant greater than about 3.9) dielectric material that may include hafnium oxide, titanium oxide, hafnium zirconium oxide, tantalum oxide, hafnium silicon oxide, zirconium oxide, zirconium silicon oxide, combinations thereof, or other suitable materials. The gate electrode 142 may include one or more work function layers and a metal fill layer. The one or more work function layers may include n-type work function layers and/or p-type work function layers. Example n-type work function layers may be formed of aluminum, titanium aluminide, titanium aluminum carbide, tantalum silicon carbide, tantalum silicon aluminum, tantalum silicide, or hafnium carbide. Example p-type work function layers may be formed of titanium nitride, titanium silicon nitride, tantalum nitride, tungsten carbonitride, or molybdenum. The metal fill layer may be formed of a metal, such as tungsten (W), ruthenium (Ru), cobalt (Co) or copper (Cu). The metal fill layer 146 for the ESD source/drain contacts 110E may be formed of tungsten (W), ruthenium (Ru), cobalt (Co), nickel (Ni), or copper (Cu). The barrier layer 144 may be formed of titanium nitride (TiN), tantalum nitride (TaN), titanium (Ti), molybdenum (Mo), cobalt nitride (CoN), tungsten nitride (WN), or titanium silicon nitride (TiSiN).

The eighth semiconductor device 100-8 includes the insulation layer 180 on a back surface of the substrate 102 and a backside metal line 206 is embedded in the insulation layer 180. In the depicted embodiment, the backside metal line 206 is disposed directly below one of the source/drain region. Because the backside metal line 206 is completely enclosed in the second implantation region 106P and sufficiently spaced apart from the intrinsic portion 103, the backside metal line 206 does not create risks of shorts and the eighth semiconductor device 100-8 may function as an ESD diode or ESD protection device. The locational constraints of the backside metal line 206 will be described in more details in conjunction with FIGS. 10 and 11.

Figure 10:
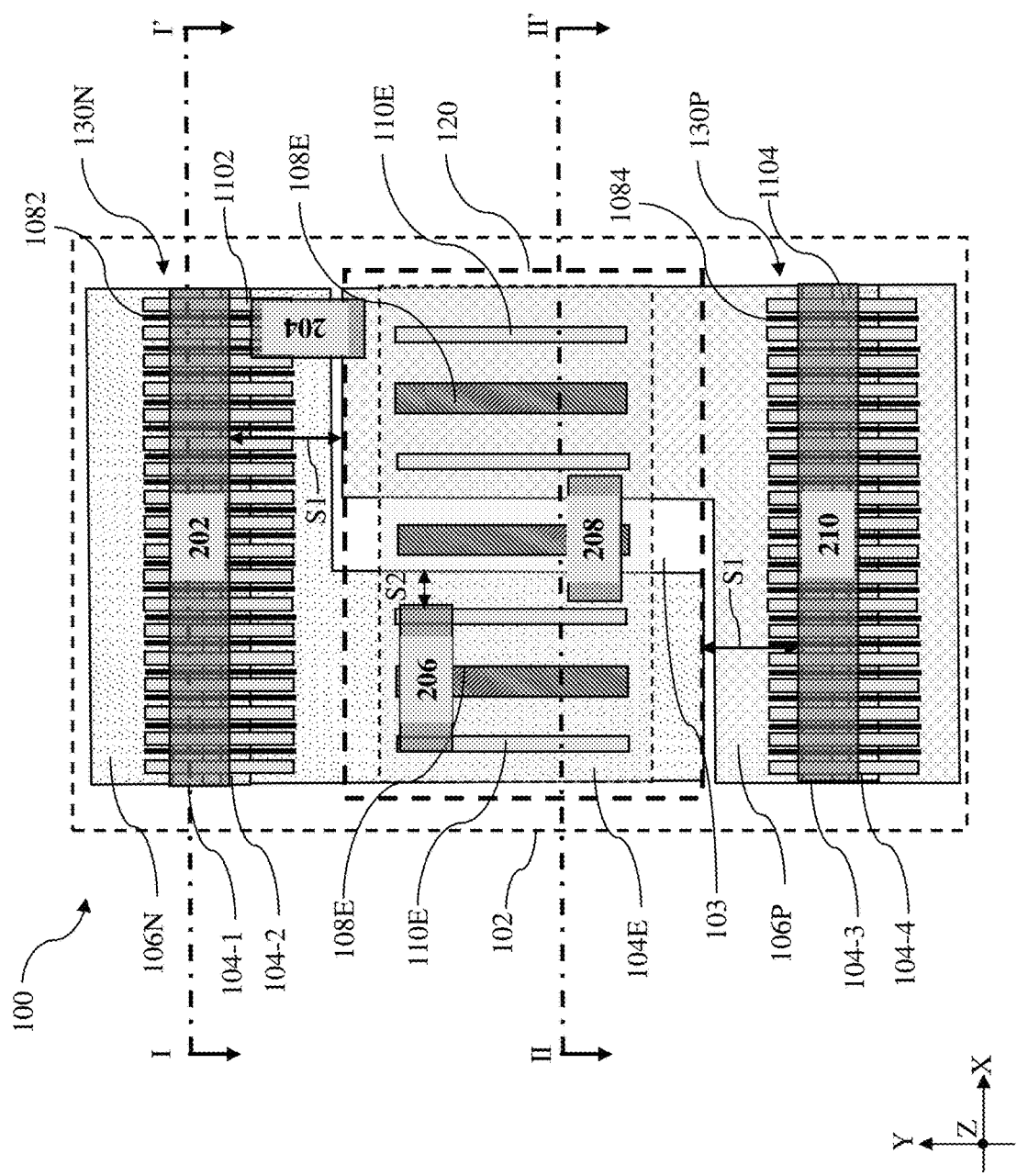
FIGS. 10 and 11 are top views of examples of semiconductor devices with underlying backside metal lines, according to various aspects of the present disclosure.

Reference is made to FIG. 10, which illustrates a semiconductor structure 100 with various potential backside metal line placement. As shown in FIG. 10, the semiconductor structure 100 includes the backside power rail 202 below the n-type pick-up area 130N, the backside power rail 210 below in the p-type pick-up area 130P, the backside metal line 206, a backside metal line 208, and a backside metal line 204. With respect to the backside power rail 202, the backside power rail 202 in the first implantation region 106N is a first spacing S1 away from a closest boundary of the second implantation region 106P. It is observed that the first spacing S1 should be at least 60 nm to maintain proper operation of the ESD devices in the ESD area 120. In some instances, the first spacing S1 may be between 60 nm and 100 nm. When the first spacing S1 is greater than 100, the cell height of the n-type pick up area 130N may be unnecessary enlarged. Similarly, the backside power rail 210 in the second implantation region 106P is also the first spacing S1 away from a closest boundary of the first implantation region 106N. The backside metal line 206 is a second spacing S2 away from the intrinsic portion 103. It is observed that because dopants may be unintentionally implanted or doped in the intrinsic portion 103, the second spacing S2 should be at least 100 nm in order to reduce the risks of shorts or premature breakdown. In some instances, the second spacing S2 may be between about 100 nm and about 150 nm. When the second spacing S2 is greater than 150 nm, the gate pitch in the ESD area 120 may be unnecessarily enlarged. The location of the backside metal line 208 is not desirable because it spans over the first implantation region 106N and the second implantation region 106P and may cause shorts or premature breakdown. It is also observed that the placement of the backside metal line 204 may create risks of shorts or failure because a majority of the backside metal line 204 is in the first implantation region 106N while an edge of the backside metal line 204 cuts into the second implantation region 106P. In the embodiments represented in FIG. 10, the first implantation region 106N and the second implantation region 106P extend all the way through the wide active regions 104E and the substrate 102, as similarly illustrated in FIGS. 5-9.

Figure 11:
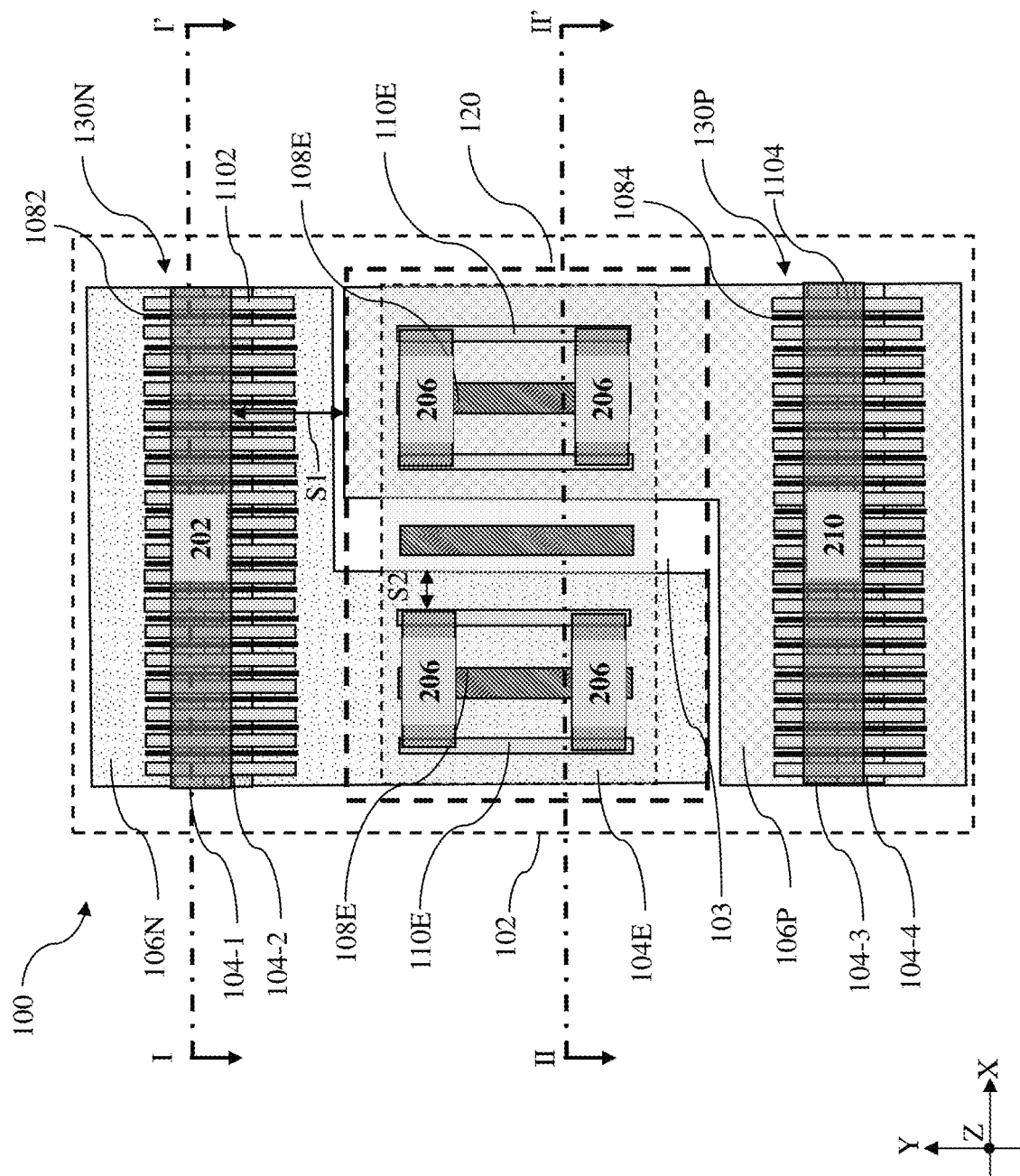

Reference is made to FIG. 11, which illustrates a semiconductor structure 100 with backside power rails and backside metal lines that are placed according to some aspects of the present disclosure. As shown in FIG. 11, the semiconductor structure 100 includes the backside power rail 202 below the n-type pick-up area 130N, the backside power rail 210 below in the p-type pick-up area 130P, and the backside metal lines 206. The backside power rail 202 in the first implantation region 106N is spaced apart from a closest boundary of the second implantation region 106P by the first spacing S1. The first spacing S1 should be at least 60 and may be between 60 nm and 100 nm. Similarly, the backside power rail 210 in the second implantation region 106P is spaced apart from a closest boundary of the first implantation region 106N by the first spacing S1. The backside metal lines 206 are enclosed completely in the first implantation region 106N or the in second implantation region 106P. That is, each of the backside metal line 206 is spaced apart from the intrinsic portion 103 by the second spacing S2. The second spacing S2 should be at least 100 nm and may be between about 100 nm and about 150 nm. In the embodiments represented in FIG. 11, the first implantation region 106N and the second implantation region 106P extend all the way through the wide active regions 104E and the substrate 102, as similarly illustrated in FIGS. 5-9. Based on experimental results, in order to prevent density loading effect during the subsequent backside CMP process, the backside metal lines (including backside power rails) may have an aerial density between about 30% and about 75% with respect to the backside surface of the semiconductor substrate 102. In some implementations, the backside metal lines (including backside power rails) may have a length between about 125 nm and about 175 nm and a width between about 35 nm and 45 nm. When the backside metal lines are too narrow or too short, the process window may be reduced. When the backside metal lines are wide or too long, the aforementioned placement constraints may be violated.

In one example aspect, the present disclosure provides a semiconductor device in accordance with some embodiments. The semiconductor device includes a substrate, a fin-shaped structure disposed over the substrate, the fin-shaped structure including a plurality of first semiconductor layers interleaved by a plurality of second semiconductor layers, a gate structure disposed over a channel region of the fin-shaped structure, a first source/drain feature extending through at least a first portion the fin-shaped structure, a second source/drain feature extending through at least a second portion of the fin-shaped structure, and a backside metal line disposed below the substrate and spaced apart from the first source/drain feature and the second source/drain feature.

In some embodiments, the plurality of first semiconductor layers include silicon and the plurality of second semiconductor layers include silicon germanium. In some implementations, a thickness of the substrate is between about 20 nm and about 30 nm. In some instances, the first source/drain feature includes a first implantation region and the second source/drain feature includes a second implantation region. In some embodiments, the first implantation region includes an n-type dopant. In some instances, the second implantation region includes a p-type dopant. In some embodiments, the gate structure does not extend between adjacent ones of the plurality of first semiconductor layers. In some implementations, the gate structure is electrically floating. In some embodiments, each of the first source/drain feature and the second source/drain feature extends through the fin-shaped structure and into the substrate.

Another aspect of the present disclosure pertains to a semiconductor structure. The semiconductor structure includes a substrate having an electrostatic discharge (ESD) area, an n-type pick-up area, and a p-type pick-up area, a first active region disposed over the n-type pick-up area, a second active region disposed over the ESD area, a third active region disposed over the p-type pick-up area, an n-type implantation region over the n-type pick-up area and a first portion of the ESD area, and a p-type implantation region over the p-type pick-up area and a second portion of the ESD area.

In some embodiments, each of the n-type implantation region and the p-type implantation region is L-shaped in a top view. In some embodiments, the first active region includes a first width, the second active region includes a second width, and a ratio of the second width to the first width is between 5 and 12. In some implementations, the ESD area further includes an intrinsic portion disposed between the first portion and the second portion. In some instances, the semiconductor structure further includes a first gate structure disposed over the first portion of the second active region, a second gate structure disposed over the intrinsic portion of the second active region, and a third gate structure disposed over the second portion of the second active region. In some embodiments, the semiconductor structure may further include a first backside power rail disposed below the substrate and a second backside power rail disposed below the substrate. The first backside power rail is disposed directly below the first active region and the second backside power rail is disposed directly below the first gate structure. In some instances, the second backside power rail is spaced apart from the intrinsic portion by at least 100 nm. In some embodiments, the second backside power rail is completely within a vertical projection area of the n-type implantation region.

Yet another aspect of the present disclosure pertains to a semiconductor structure. The semiconductor structure includes a substrate that includes an electrostatic discharge (ESD) area, an n-type pick-up area, and a p-type pick-up area, a first active region disposed over the n-type pick-up area, a second active region disposed over the ESD area, a third active region disposed over the p-type pick-up area, an n-type implantation region over the n-type pick-up area and a first portion of the ESD area, a p-type implantation region over the p-type pick-up area and a second portion of the ESD area, a first gate structure disposed over the first portion of the second active region, a second gate structure disposed over an intrinsic portion of the second active region, the intrinsic portion being disposed between the first portion and the second portion, and a third gate structure disposed over the second portion of the second active region.

In some embodiments, each of the first gate structure, the second gate structure and the third gate structure is electrically floating. In some implementations, each of the first active region, the second active region and the third active region includes a plurality of silicon layers interleaved by a plurality of silicon germanium layers.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
   a substrate;
   a fin-shaped structure disposed over the substrate, the fin-shaped structure comprising a plurality of first semiconductor layers interleaved by a plurality of second semiconductor layers;

a gate structure disposed over a channel region of the fin-shaped structure;
a first source/drain feature extending through at least a first portion the fin-shaped structure;
a second source/drain feature extending through at least a second portion of the fin-shaped structure; and
a backside metal line disposed below the substrate and spaced apart from the first source/drain feature and the second source/drain feature.

2. The semiconductor device of claim 1,
wherein the plurality of first semiconductor layers comprise silicon,
wherein the plurality of second semiconductor layers comprise silicon germanium.

3. The semiconductor device of claim 1, wherein a thickness of the substrate is between about 20 nm and about 30 nm.

4. The semiconductor device of claim 1,
wherein the first source/drain feature comprises a first implantation region and the second source/drain feature comprises a second implantation region.

5. The semiconductor device of claim 4, wherein the first implantation region comprises an n-type dopant.

6. The semiconductor device of claim 5, wherein the second implantation region comprises a p-type dopant.

7. The semiconductor device of claim 1, wherein the gate structure does not extend between adjacent ones of the plurality of first semiconductor layers.

8. The semiconductor device of claim 1, wherein the gate structure is electrically floating.

9. The semiconductor device of claim 1,
wherein each of the first source/drain feature and the second source/drain feature extends through the fin-shaped structure and into the substrate.

10. A semiconductor structure, comprising:
a substrate comprising an electrostatic discharge (ESD) area, an n-type pick-up area, and a p-type pick-up area;
a first active region disposed over the n-type pick-up area;
a second active region disposed over the ESD area;
a third active region disposed over the p-type pick-up area;
an n-type implantation region over the n-type pick-up area and a first portion of the ESD area; and
a p-type implantation region over the p-type pick-up area and a second portion of the ESD area.

11. The semiconductor structure of claim 10,
wherein each of the n-type implantation region and the p-type implantation region is L-shaped in a top view.

12. The semiconductor structure of claim 10,
wherein the first active region comprises a first width,
wherein the second active region comprises a second width,
wherein a ratio of the second width to the first width is between 5 and 12.

13. The semiconductor structure of claim 10, wherein the ESD area further comprises an intrinsic portion disposed between the first portion and the second portion.

14. The semiconductor structure of claim 13, further comprising:
a first gate structure disposed over the first portion of the second active region;
a second gate structure disposed over the intrinsic portion of the second active region; and
a third gate structure disposed over the second portion of the second active region.

15. The semiconductor structure of claim 14, further comprising:
a first backside power rail disposed below the substrate, wherein the first backside power rail is disposed directly below the first active region, and
a second backside power rail disposed below the substrate, wherein the second backside power rail is disposed directly below the first gate structure.

16. The semiconductor structure of claim 15, wherein the second backside power rail is spaced apart from the intrinsic portion by at least 100 nm.

17. The semiconductor structure of claim 15, wherein the second backside power rail is completely within a vertical projection area of the n-type implantation region.

18. A semiconductor structure, comprising:
a substrate comprising an electrostatic discharge (ESD) area, an n-type pick-up area, and a p-type pick-up area;
a first active region disposed over the n-type pick-up area;
a second active region disposed over the ESD area;
a third active region disposed over the p-type pick-up area;
an n-type implantation region over the n-type pick-up area and a first portion of the ESD area;
a p-type implantation region over the p-type pick-up area and a second portion of the ESD area;
a first gate structure disposed over the first portion of the second active region;
a second gate structure disposed over an intrinsic portion of the second active region, the intrinsic portion being disposed between the first portion and the second portion; and
a third gate structure disposed over the second portion of the second active region.

19. The semiconductor structure of claim 18, wherein each of the first gate structure, the second gate structure and the third gate structure is electrically floating.

20. The semiconductor structure of claim 18, wherein each of the first active region, the second active region and the third active region comprises a plurality of silicon layers interleaved by a plurality of silicon germanium layers.

* * * * *